(12) United States Patent
Belouet et al.

(10) Patent No.: US 8,256,373 B2
(45) Date of Patent: Sep. 4, 2012

(54) DEVICE FOR DEPOSITING A LAYER OF POLYCRYSTALLINE SILICON ON A SUPPORT

(75) Inventors: Christian Belouet, Sceaux (FR); Claude Remy, Limonest (FR)

(73) Assignee: Solarforce, Limonest (FR)

( * ) Notice: Subject to any disclaimer, the term of this patent is extended or adjusted under 35 U.S.C. 154(b) by 836 days.

(21) Appl. No.: 10/584,698

(22) PCT Filed: Dec. 10, 2004

(86) PCT No.: PCT/FR2004/050674
§ 371 (c)(1), (2), (4) Date: May 25, 2007

(87) PCT Pub. No.: WO2005/064034
PCT Pub. Date: Jul. 14, 2005

(65) Prior Publication Data
US 2007/0214839 A1    Sep. 20, 2007

(30) Foreign Application Priority Data
Dec. 24, 2003 (FR) ..................... 03 51203

(51) Int. Cl.
*B05C 3/12* (2006.01)
(52) U.S. Cl. ................... 118/405; 427/434.7
(58) Field of Classification Search .......... 118/405, 118/404, 419, 401; 427/86, 434.2, 434.7; 65/336, 337, 340
See application file for complete search history.

(56) References Cited

U.S. PATENT DOCUMENTS 4,520,752 A * 6/1985 Belouet ............... 118/405
4,616,595 A * 10/1986 Belouet ............... 118/405

FOREIGN PATENT DOCUMENTS

| FR | 2386359 | 4/1977 |
| FR | 2550965 | 3/1985 |
| WO | WO0104388 | * 1/2001 |

OTHER PUBLICATIONS

International Search Report—Jun. 21, 2005.

* cited by examiner

*Primary Examiner* — Matthew Daniels
*Assistant Examiner* — Yana Belyaev
(74) *Attorney, Agent, or Firm* — Sofer & Haroun, LLP

(57) ABSTRACT

The present invention relates to a device (100) for depositing a layer based on polycrystalline silicon onto a substantially plane, elongate, moving support (4) having two longitudinal faces (43, 44) and two longitudinal side edges (41, 42), the device comprising:

a crucible (1) containing a bath (2) of molten silicon, said support (4) being designed to be dipped at least in part in the bath and to pass substantially vertically in its long direction through the equilibrium surface (21) of the bath; and at least one edge control element (5, 5'), each edge control element being maintained substantially vertically close to one of the two longitudinal side edges (41, 42);

each edge control element comprising walls (51 to 53') defining a longitudinal slot (54, 54') beside the corresponding longitudinal side edge, each slot being dipped in part in the bath (2) so as to raise the level of the bath by capillarity in the vicinity of the corresponding longitudinal side edge, the device being characterized in that at least one of the walls (51 to 52'), referred to as an "insertion" wall, facing part of one of the longitudinal faces, is substantially plane.

20 Claims, 3 Drawing Sheets

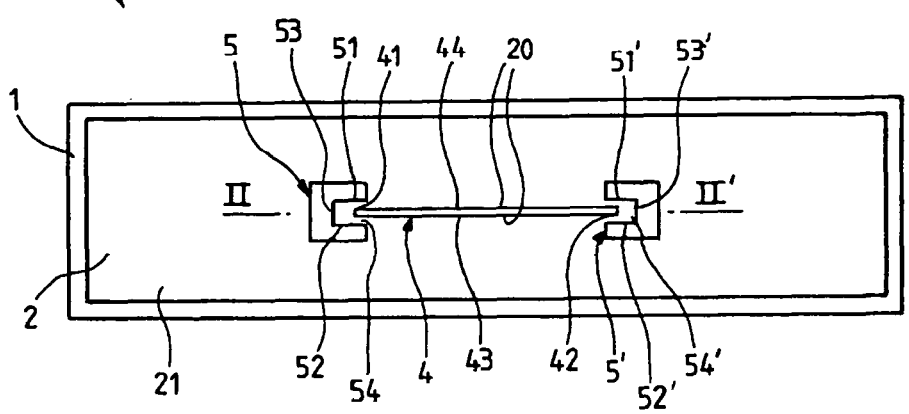
FIG_1
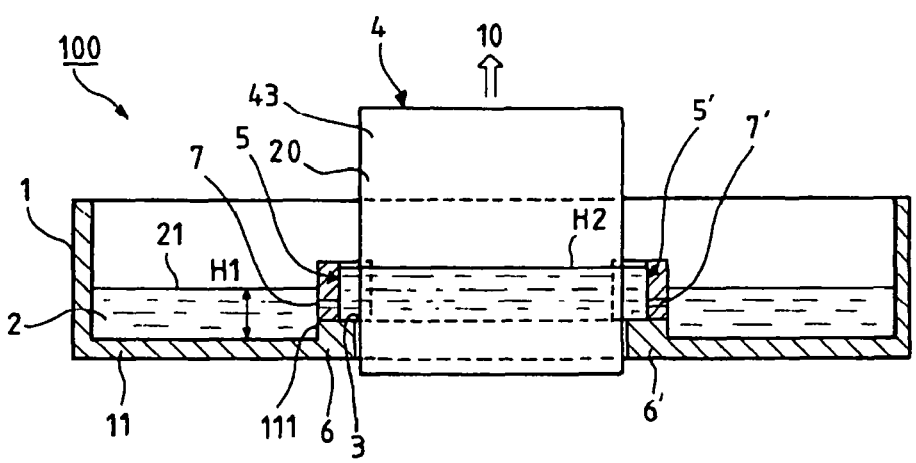
FIG_2

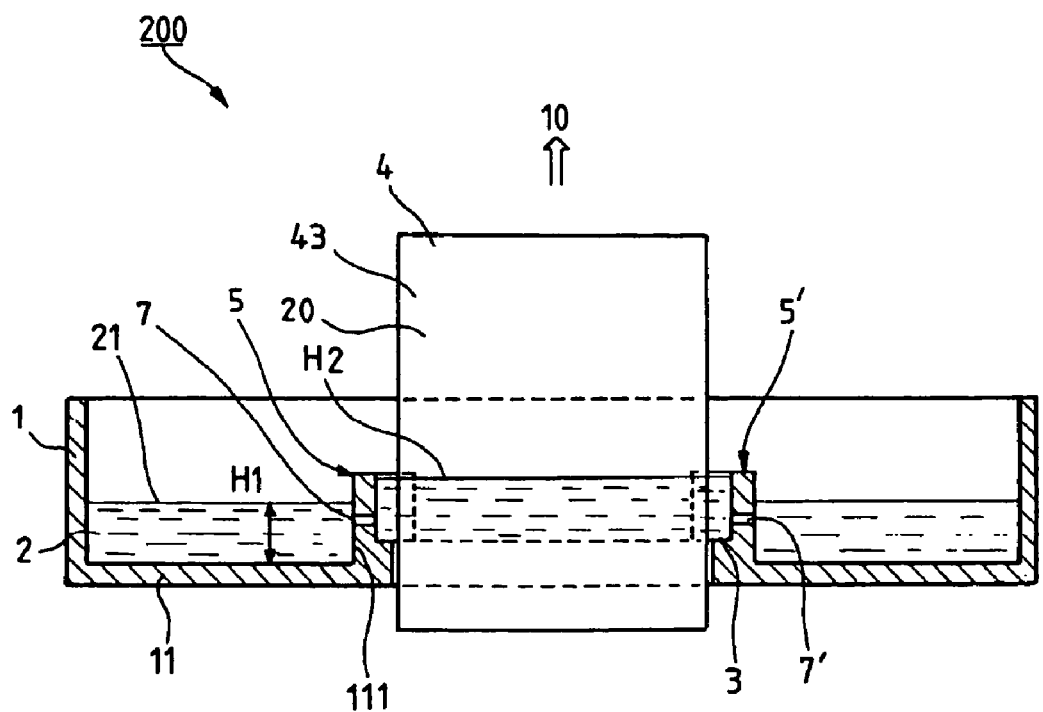
FIG_3

FIG_4
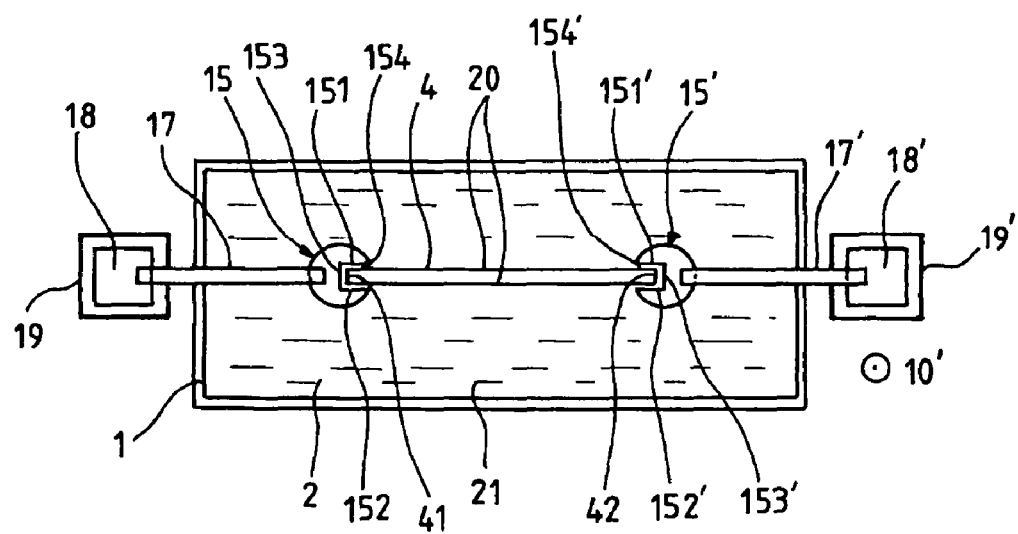

DEVICE FOR DEPOSITING A LAYER OF POLYCRYSTALLINE SILICON ON A SUPPORT

RELATED APPLICATIONS

The present application is a national phase application of PCT/FR2004/050674, which in turn claims the benefit of priority from French Patent Application No. 03 51 203 filed Dec. 10, 2004, filed on Dec. 24, 2003, the entirety of which are incorporated herein by reference.

FIELD OF THE INVENTION

The present invention relates to a device for depositing a layer of polycrystalline silicon on an elongate support that is substantially plane, the device being of the type comprising a crucible containing a bath of molten silicon, a support dipped at least in part in the bath and passing substantially vertically and in the long direction of the support through the equilibrium surface of the bath.

BACKGROUND OF THE INVENTION

In a known device of that type, for example as described in document FR 2 386 359, the bottom of the crucible includes a narrow slot through which the support, which is a carbon ribbon, penetrates into the bath and passes vertically therethrough, traveling in an upward direction.

Nevertheless, it is found that the thickness of the silicon layer deposited on the faces of the ribbon decreases rapidly on approaching the two side edges of the ribbon. This results in the deposited layer of silicon presenting two lateral margins along each of the two side edges with physical characteristics that are degraded relative to those in the middle portion of the layer. These side margins are practically unusable, in particular for making photovoltaic cells, and they constitute sources of fractures occurring in the silicon layers.

On the edges of the carbon ribbon, the liquid silicon meniscus changes from a two-dimensional shape with a solid-liquid connection line situated about 6.8 millimeters (mm) above the bath, to a shape that is circularly symmetrical. Under such circumstances, the solid-liquid connection line, which to the first order is a function of the thickness of the carbon ribbon in the absence of any particular control means, becomes situated at a height that is very low above the bath. In the "transition" zone up to the edge of the ribbon, i.e. over a width of about 5 mm, the solid-liquid connection line moves down from 6.8 mm to a value that is typically 1 mm to 2 mm. In this zone, the thickness of the deposit decreases rapidly. The deposit becomes fragile and its crystal quality is degraded (grains of small size).

In an attempt to control the edges, a device is disclosed in document FR 2 550 965 that further includes two chutes of semicircular section that are held vertically respectively on either side of the side edges of the ribbon passing through the bath. The concave sides of the chutes face towards the respective side edges of the ribbon, with the chutes being dipped in part in the bath so as to raise the level of the bath by capillarity in the vicinity of the side edges of the ribbon.

In order to control the capillary rise of liquid silicon along the chutes, the following parameters should be varied: the inside diameter of the chutes, and the distance and orientation of the chutes relative to the edges of the ribbon.

That device does indeed make it possible to make deposits of silicon on a carbon ribbon with an increase in the useful area deposited, presenting fewer fractures, and with the deposited silicon layers presenting improved electrical properties.

Nevertheless, that device is still not optimized. The raising of the solid-liquid connection line at the edges remains small, and the transition zone is still too wide. In addition, the reduction in the thickness in the margins remains large and this zone continues to be a source for generating fractures during cooling and subsequent handling of the ribbon.

OBJECTS AND SUMMARY OF THE INVENTION

The object of the invention is to obtain better control over the thickness and the quality of the deposit on the edges of the support, preferably by means that are reliable and simple on an industrial scale.

To this end, the invention provides a device for depositing a layer based on polycrystalline silicon onto a substantially plane, elongate, moving support having two longitudinal faces and two longitudinal side edges, the device comprising:
  a crucible containing a bath of molten silicon, said support being designed to be dipped at least in part in the bath and to pass substantially vertically in its long direction through the equilibrium surface of the bath; and
  at least one edge control element, each edge control element being maintained substantially vertically close to one of the two longitudinal side edges;
  each edge control element comprising walls defining a longitudinal slot beside the corresponding longitudinal side edge, each slot being dipped in part in the bath so as to raise the level of the bath by capillarity in the vicinity of the corresponding longitudinal side edge,
  the device being characterized in that at least one of the walls, referred to as an "insertion" wall, facing part of one of the longitudinal faces, is substantially plane.

By edge control, growth conditions are extended in the lateral margins to come as close as possible to the edges: the thickness and the crystal texture of the deposit is maintained.

The slot of the invention is more easily adjusted than is the semicircular chute of the prior art. Instead of adjusting the inside diameter of a semicircular chute, it is possible to adjust a plurality of parameters independently: the spacing between the walls, the length of each insertion wall, or indeed the shape of the "bottom" wall (curved or likewise plane).

The presence of an edge control element has an effect on the temperature in the liquid sheet in the immediate vicinity of the corresponding edge of the support by locally modifying heat exchange within the bath and to some extent within the support (radiant exchange with the outside is modified by the presence of the elements).

Furthermore, the shape of the outside surface of the control element situated opposite from the slot can also be selected freely.

Advantageously, the device of the invention has two edge control elements, with each edge control element having two substantially plane insertion walls. Such a device can raise the level of the bath over each longitudinal face of the support and at each longitudinal edge.

Nevertheless, the present invention is not restricted to the number of insertion walls being equal to four. A device of the invention could have a single edge control element with a single insertion wall facing one of the substantially plane longitudinal faces.

The insertion walls are preferably either parallel or outwardly flared.

Advantageously, the mean depth of each slot may be less than 1 centimeter (cm), and the mean spacing between the insertion walls may also be less than 7 mm. Such characteristics are naturally not limiting.

In a first embodiment, the crucible has a bottom and side walls, and each of the edge control elements is stationary and held vertically by the bottom. It can be held by screw fastening, for example. The present invention is naturally not limited by the way in which the element is held.

In this first embodiment, the edge control elements are not displaceable. This is particularly adapted to production in which pulling takes place automatically and possibly without being monitored. In addition, such a device is robust and stable.

Furthermore, each of the edge control elements can extend longitudinally down to the bottom and is preferably formed monolithically with the bottom. Each of the edge control elements may also present at least one orifice dipped in the bath and suitable for feeding said element with silicon so as to enable the bath to be fed onto the margins. The orifice is preferably of millimeter order and is situated close to the bottom.

In a second embodiment, each of the edge control elements comprises a plate including said slot, which plate is brought into contact with the equilibrium surface of the bath.

Contact with the surface of the bath preferably takes place by the plate being connected to displacement means external to the crucible and preferably allowing vertical displacement only.

Each plate preferably comprises a disk including said slot, which disk may present an effective diameter greater than 10 mm, and preferably of the order of 12 mm.

Furthermore, in this second embodiment, the mean spacing between the insertion walls may be about 2 mm.

Each of the edge control elements may be based on a material that does not react with silicon and that is preferably selected from graphite, silicon carbide, and silicon nitride.

The edge control elements preferably present emissivity that is greater than the emissivity of silicon.

BRIEF DESCRIPTION OF THE DRAWINGS

These characteristics are naturally not limiting.

Other characteristics and advantages of the present invention appear from the following description of embodiments of the invention given by way of non-limiting illustration.

In the figures:

FIG. 1 is a diagram showing a first embodiment of a device of the invention, seen from above;

FIG. 2 is a three-dimensional diagram of the FIG. 1 device in section on a vertical plane;

FIG. 3 is a diagram showing a second embodiment of the device of the invention, in section on a vertical plane; and FIG. 4 is a diagram of a third embodiment of the device of the invention as seen from above.

DETAILED DESCRIPTION

Below, elements that are identical or analogous (in function and/or structure) are given the same references in all of the embodiments of the invention.

The figures shown are not to scale.

FIGS. 1 and 2 show a first device 100 for depositing a layer based on polycrystalline silicon on a substantially plane elongate moving support.

The device 100 comprises a rectangular crucible 1 made of graphite and containing a bath 2 of molten silicon. The bottom 11 of the crucible includes a vertical rib 111 of rectangular cross-section defining a narrow linear slot 3 through which a plane support such as a carbon ribbon 4 passes vertically. The ribbon has two longitudinal faces 43 and 44 and two longitudinal side edges 41 and 42, and it leaves the bath 2 by passing through its horizontal equilibrium surface 21. The width of the slot 3 is determined so that the meniscus connecting it to the liquid silicon is stable in the slot 3, and is equal to abut 600 micrometers (µm) for example. The thickness of the carbon ribbon 4 is typically about 250 µm.

In operation, when the ribbon 4 moves in the direction of arrow 10, a layer 20 of polycrystalline silicon is deposited on each of the faces 43 and 44 of the ribbon 4 on leaving the bath 2.

The device 100 further comprises two edge control elements 5, 5' maintained substantially vertical on either side of the two longitudinal side edges 41 and 42.

Nominal conditions for pulling the ribbon are defined so as to obtain plane silicon films of thickness equal to a constant predetermined value, e.g. 80 µm to 100 µm in their lateral margins and if possible all the way to their edges, by pulling at a given speed, e.g. 8 centimeters per minute (cm/min) to 10 cm/min.

Each of the edge control elements 5, 5' has walls 51 to 53, 51' to 53' defining a longitudinal slot 54, 54' individually overlapping one of the longitudinal side edges 41, 42. Each slot is partially dipped in the bath 2 so as to raise the level of the bath by capillarity in the vicinity of the corresponding longitudinal side edge.

For each edge control element 5, 5', two so-called "insertion" walls 51 & 52, 51' & 52' partially facing the corresponding longitudinal face 43, 44 of the ribbon 4 are plane and, for example, parallel.

It is possible to control the rise by capillarity of liquid silicon along the slots by varying the following parameters:
   the spacing between and the lengths of the insertion walls 51 & 52, 51' & 52'; and
   the degree of insertion relative to the edges 41, 42.

By adjusting these parameters, it is thus possible to raise the crystallization isothermal on the edges of the ribbon relative to the curve that would be obtained with a prior art device.

The depth of each slot 54, 54' is less than 1 cm. The spacing between the insertion walls is less than 7 mm.

The control elements 5, 5' are placed relative to the edges 41, 42 of the ribbon in such a manner as to obtain a crystallization isothermal that is rectilinear across the entire width of the ribbon 4.

Each of the control elements 5, 5' is stationary and held vertically by the bottom 11. More precisely, each of them comprises a fitting that extends longitudinally and that is secured to the bottom 11 on the top face of the rib 111, e.g. by a pair of graphite screws 6, 6' (screws not visible but represented by dashed lines in FIG. 2).

This enables more complex shapes to be made and reduces the cost of fabricating the crucible 1. The material can be the same or different from that of the crucible. It is selected to be non-reactive with silicon and to present emissivity that is greater than the emissivity of silicon.

Furthermore, each of the edge control elements 5, 5' presents at least one orifice 7, 7' dipped in the bath 2 and suitable for feeding silicon, which orifice is preferably situated close to the bottom 11. Furthermore, the device is shown without a lid.

The edge control elements 5, 5' are preferably identical and positioned at the same level relative to the respective edges 41, 42 and faces 43, 44 of the ribbon 4.

Naturally, in practice, the device 100 also includes heater means (not shown) disposed around the crucible in order to maintain the silicon in the liquid state.

Furthermore, the depths H1, H2 of the bath can be regulated by appropriate means, e.g. to a nominal value ±200 μm.

FIG. 3 is a diagram showing a second embodiment of a device 200 of the invention, in section on a vertical plane.

This is a variant of the first embodiment. In this second embodiment, the edge control elements 5, 5' extend longitudinally to the bottom 11 and also form a monolithic structure with the bottom 11.

FIG. 4 is a diagram of a third embodiment of the device 300 of the invention, as seen from above.

This device 300 has two edge control embodiments 15, 15' held substantially vertically on either side of the two longitudinal side edges 41, 42.

Each of the edge control elements 15, 15' has walls 151 to 153, 151' to 153' defining a longitudinal slot 154, 154' each overlying one of the longitudinal side edges 41, 42 of the ribbon 4. Each slot 154, 154' is dipped in part in the bath 2 so as to raise the level of the bath by capillarity in the vicinity of the corresponding longitudinal side edge 41, 42.

More precisely, each of the edge control elements comprises a respective plate 15, 15', e.g. having a thickness of about 1 mm, with a bottom horizontal surface in contact with the horizontal equilibrium surface 21 of the bath 2, and it is raised to a predetermined height above said equilibrium surface 21.

These plates 15, 15' are also provided with the above-mentioned slots 154, 154'. By way of example, these plates 15, 15' may be circular having an effective diameter greater than 10 mm.

The plates 15, 15' are made of a material that is wettable by liquid silicon and they present emissivity that is greater than the emissivity of silicon, e.g. they are made of graphite.

For each control element 15, 15', two so-called "insertion" walls 151 & 152, 151' & 152' partially facing the corresponding longitudinal faces 41, 42 are plane, and for example parallel.

The mean spacing between the insertion walls is selected to about 2 mm.

Each plate 15, 15' is secured by a support. For example, an off-center point in each of said plates is secured to one end of a rod 17, 17' that is preferably made of graphite and in the form of a bracket. The other end of each rod is secured to the outlet 18, 18' of a mechanical system 19, 19' capable of controlling movement of the plates, preferably solely along the vertical axis 10', said system being located outside the crucible 1.

Edge control as described above can contribute to increasing the manufacturing yield of silicon plates. It also presents the undeniable advantages such as:
- an increase in usable area: typically a total width of 10 mm per face;
- the provision of silicon deposits on a carbon ribbon, these deposits possessing relatively few fractures; and
- an improvement in the electrical properties of the silicon layers at the edges, where the invention makes it possible for the grains to present substantially the same texture as the grains in the lateral margin of the deposit.

The device of the present invention can be applied to making photovoltaic cells.

Naturally, the invention is not limited to the embodiments described above.

The invention claimed is:

1. A device for depositing a layer based on polycrystalline silicon onto a substantially plane, elongate, moving support having two longitudinal faces and two longitudinal side edges, the device comprising:
   a crucible containing a bath of molten silicon, said support being designed to be dipped at least in part in the bath and to pass substantially vertically in its long direction through the equilibrium surface of the bath; and
   at least one edge control element, each edge control element being maintained substantially vertically close to one of the two longitudinal side edges so that the level of the bath raises over each longitudinal face of the support;
   each edge control element comprising walls defining a longitudinal slot beside the corresponding longitudinal side edge, each slot being dipped in part in the bath so as to raise the level of the bath by capillarity in the vicinity of the corresponding longitudinal side edge,
   wherein at least one of the walls, referred to as an "insertion" wall, facing part of one of the longitudinal faces, is substantially plane, and wherein the longitudinal slot individually overlaps one of the longitudinal side edges.

2. A device according to claim 1, for depositing a layer based on polycrystalline silicon and comprising two edge control elements, in which each edge control element includes two substantially plane insertion walls.

3. A device according to claim 2, for depositing a layer based on polycrystalline silicon, the device being wherein the insertion walls are either parallel or eke outwardly flared.

4. A device according to claim 2, for depositing a layer based on polycrystalline silicon, wherein the mean depth of each slot is less than 1 cm.

5. A device according to clam 2, for depositing a layer based on polycrystalline silicon, wherein the mean spacing between the insertion walls is less than 7 min.

6. A device according to claim 2, for depositing a layer based on polycrystalline silicon, wherein the crucible has a bottom and side walls, and each of the edge control elements being stationary and held vertically by the bottom.

7. A device according to claim 2, for depositing a layer based on polycrystalline silicon, wherein the crucible has a bottom and side walls, and each of the edge control elements extend longitudinally to the bottom and preferably forms a monolithic structure with the bottom.

8. A device according to claim 7, for depositing a layer based on polycrystalline silicon, wherein each of the edge control elements presents at least one orifice dipped in the bath and suitable for feeding silicon to said element.

9. A device according to claim 8, wherein said orifice is approximately a millimeter.

10. A device according to claim 7, wherein each of the edge control elements forms a monolithic structure with the bottom.

11. A device according to claim 2, for depositing a layer based on polycrystalline silicon, wherein each of the edge control elements are plates that include said slot, the edge control elements as plates being brought into contact with the equilibrium surface of the bath.

12. A device according to claim 11, for depositing a layer based on polycrystalline silicon, wherein contact with the surface of the bath takes place by means of a connection between the plate and displacement means external to the crucible.

13. A device according to claim 12, for depositing a layer based on polycrystalline silicon, wherein contact with the surface of the bath takes place by vertical displacement only.

14. A device according to claim 11, for depositing a layer based on polycrystalline silicon, wherein each plate is in the shape of a disk including said slot and presenting an effective diameter greater than 10 mm.

15. A device according to claim 14, wherein each plate has a disk including said slot and presenting an effective diameter equal to 12 mm.

16. A device according to claim 11, for depositing a layer based on polycrystalline silicon, wherein the mean spacing between the insertion walls is about 2 mm.

17. A device according claim 1, for depositing a layer based on polycrystalline silicon, wherein each of the edge control elements is made of a material that does not react with silicon.

18. A device according claim 17, wherein each of the edge control elements is made of a material selected from the group consisting of graphite, silicon carbide, and silicon nitride.

19. A device according claim 1, for depositing a layer based on polycrystalline silicon, wherein each of the edge control elements is made of a material presenting emissivity greater than the emissivity of silicon.

20. A device according to claim 1, wherein the device comprises two edge control elements, independent one from the other.

* * * * *

UNITED STATES PATENT AND TRADEMARK OFFICE
CERTIFICATE OF CORRECTION

PATENT NO. : 8,256,373 B2  
APPLICATION NO. : 10/584698  
DATED : September 4, 2012  
INVENTOR(S) : Christian Belouet and Claude Remy Page 1 of 1

It is certified that error appears in the above-identified patent and that said Letters Patent is hereby corrected as shown below:

Col. 6, Claim 3 Line 30: "eke" should be "else"  
Col. 6, Claim 5 Line 24: "clam" should be "claim"  
Col. 6, Claim 7 Line 44: "and preferably forms a monolithic structure with the bottom" should be removed.

Signed and Sealed this  
Twelfth Day of March, 2013

Teresa Stanek Rea  
*Acting Director of the United States Patent and Trademark Office*